United States Patent [19]

Whitehead

[11] 4,385,272

[45] May 24, 1983

[54] CABLE CHECKER UTILIZING LOGIC CIRCUITRY

[76] Inventor: Gary J. Whitehead, 435 Elm St., Milton, Wis. 53563

[21] Appl. No.: 220,256

[22] Filed: Dec. 24, 1980

[51] Int. Cl.³ .......................................... G01R 31/02
[52] U.S. Cl. ...................................................... 324/51
[58] Field of Search ........................ 324/51, 73 R, 53; 340/652, 650

[56] References Cited

U.S. PATENT DOCUMENTS

| | | | |
|---|---|---|---|
| 2,810,881 | 10/1957 | Daily | 324/51 |
| 2,862,179 | 11/1958 | Murphy | 324/51 |
| 3,131,347 | 4/1964 | Brooks et al. | 324/51 |
| 3,480,856 | 11/1969 | Scott | 324/51 |
| 3,986,106 | 10/1976 | Shuck et al. | 324/51 |

OTHER PUBLICATIONS

Graham, Logic Circuit Tests Wiring Assemblies, Electronics, Dec. 25, 1975, p. 86.
Pavasi, Jr. et al., ECG Cable Continuity Tester, Medical Instrumentation, May–Jun. 1977, pp. 178 & 179.
Johnson, Go/No-Go Tester Checks Out 16-Wire Ribbon Cable Fast, Electronics, Oct. 13, 1977, p. 108.
Strom, Designing a Simple Flat Cable Tester, Electronic Production, Jan. 1980, pp. 33, 35.

*Primary Examiner*—Stanley T. Krawczewicz
*Attorney, Agent, or Firm*—Harvey B. Jacobson

[57] ABSTRACT

A cable checker employs a pair of jacks mounted to a housing and operably associated with an electronic circuit employing a pair of digital logic integrated circuits for both the confirmation and clocking circuitry. In this respect, the integrated circuits comprise a plurality of NAND gates which drive a pair of light emitting diodes, one of which is red to indicate an improperly functioning cable and the other one of which is green to indicate a properly functioning cable. The cable checker further includes an astable multivibrator circuit so as to cause the light emitting diodes to blink thus to save battery power, and the checking of a cable is accomplished simply by plugging the two ends of the cable into the respective jacks associated with the cable checker.

9 Claims, 3 Drawing Figures

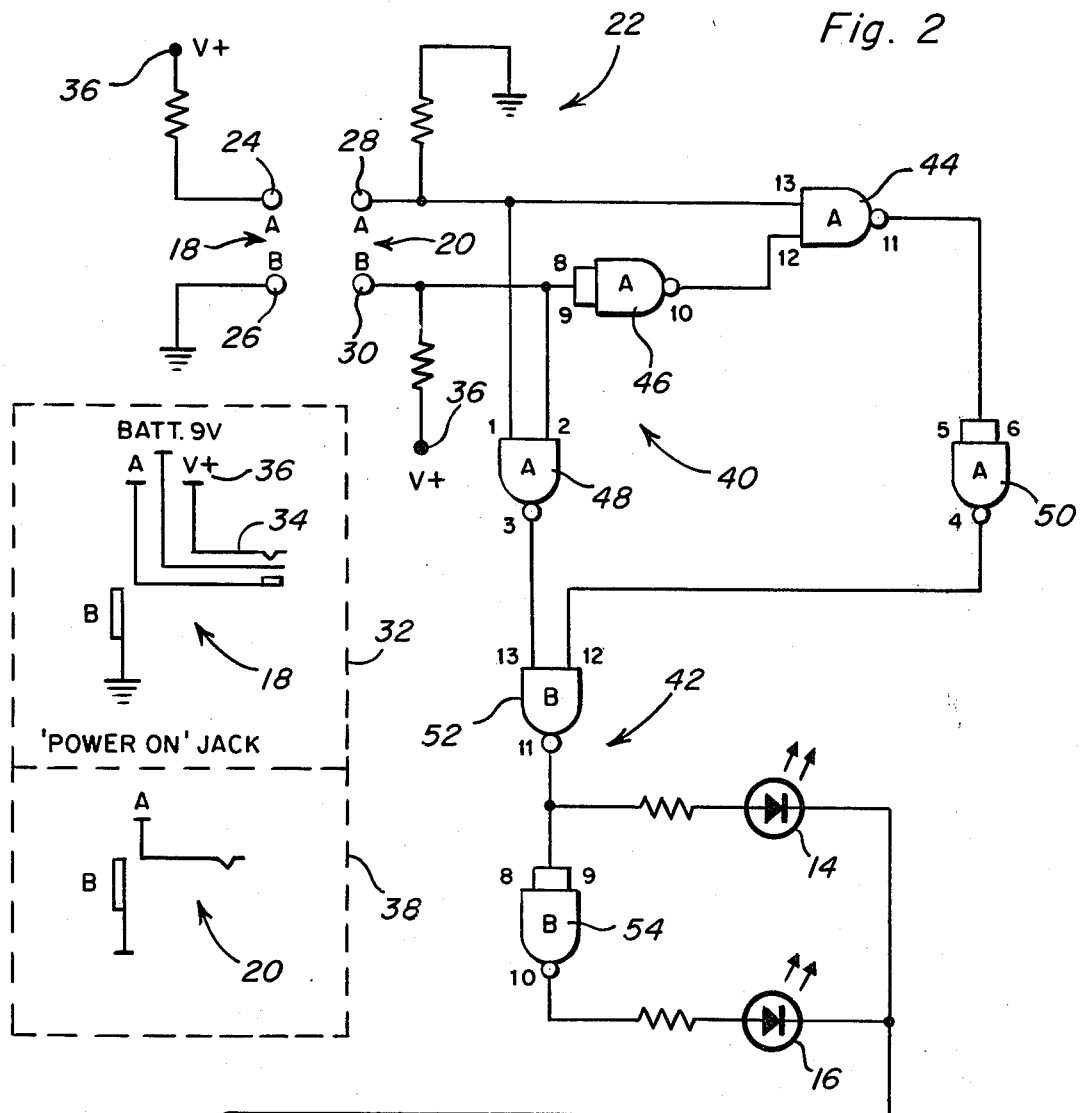
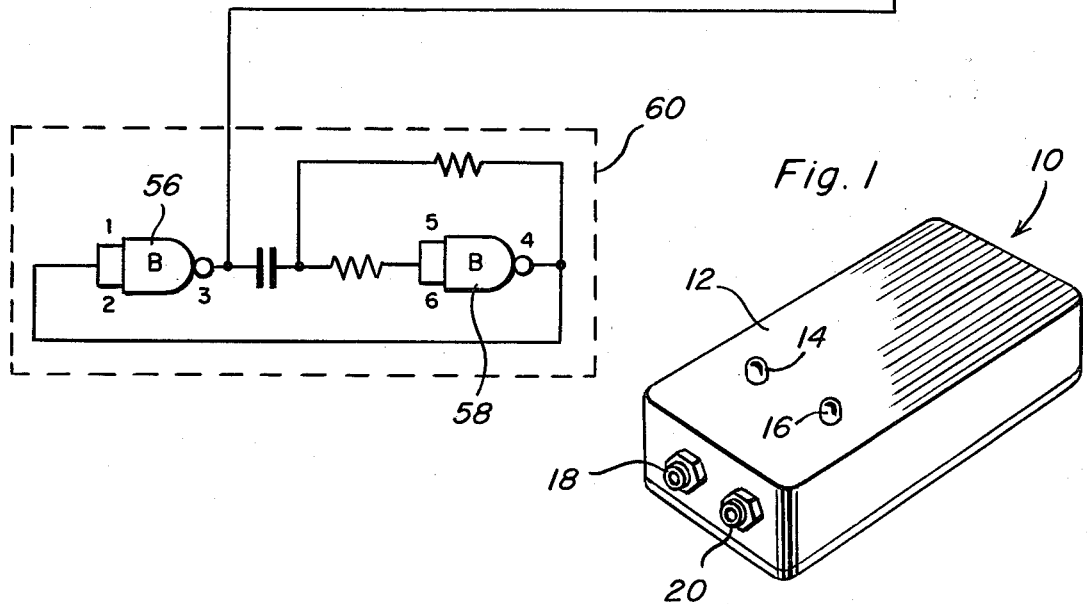
Fig. 2
Fig. 1

CABLE CHECKER UTILIZING LOGIC CIRCUITRY

BACKGROUND OF THE INVENTION

1. Field of the Invention

The present invention relates to a cable checker and more particularly pertains to a cable checker employing logic circuitry whereby the two ends of a cable may be plugged into the checker so as to drive one or the other of a pair of light emitting diodes which respectively indicate the proper or improper functioning of the cable.

2. Description of the Prior Art

With respect to devices utilizable to test for faults, such as short circuits or the like, in electrical cables, there have been a number of such devices constructed which are typically large and bulky in size, as well as complex in construction and expensive to manufacture. For example, U.S. Pat. No. 2,810,881, issued to Daily on Oct. 22, 1957, illustrates a typical prior art automatic cable tester which requires a 120 volt power supply and which employs 55 components, as well as 19 mechanical relays, switches, and potentiometers. The device further includes a pair of sockets to which the ends of a cable may be connected as well as 27 different lights to indicate both circuit operation and cable functioning.

Another cable tester which is operable to locate short and open circuits in wires is to be found in U.S. Pat. No. 2,862,179, issued to Murphy on Nov. 25, 1958, such tester employing two terminals to which a cable may be attached for test purposes. In this respect, the Murphy device is illustrative of the earlier prior art testers which made no use of logic circuitry, as with the above-mentioned Daily device, and which employed the use of meter movements, as well as a plurality of switches, to effectively test a cable. Similarly, U.S. Pat. No. 3,131,347, issued to Brooks et al on Apr. 28, 1964, illustrates a cable testing system for detecting open and short circuits which employs 15 different mechanical parts and 59 various electrical components, and further includes a 120 volt power supply and time delayed operation introduced by the mechanical closure of relays. By the same token, another prior art cable tester is to be found in U.S. Pat. No. 3,480,856, issued to Scott on Nov. 25, 1969, such tester also requiring a 120 volt power supply and utilizing 26 different components including switches and electron tubes. As with all of the aforementioned cable testers, the device of Scott is bulky in size and lacks portability and simplicity in construction.

At least one cable tester has been designed which is somewhat portable in construction and which employs some logic circuitry in its design. In this respect, U.S. Pat. No. 3,986,106, issued to Shuck et al on Oct. 12, 1976, illustrates a portable cable test set which includes a master unit connected to one end of a cable made up of multiple wire pairs and a remote unit connected to the other end of the cable. The master unit generates a series of digital pulses whereby one pulse is applied to a first wire of each wire pair in a predetermined sequence. The remote unit interconnects the wire pair with a resistor of predetermined resistance which differs from every other resistor and which is much greater than the resistance of the wire pair undergoing testing. A corresponding resistor of like value is included in the master unit and receives the same pulse as applied to the wire undergoing testing. A comparator in the master unit compares the magnitude of the pulse sent over the wire pair with the magnitude of the pulse sent through the reference resistance in the master unit, and a sequencer applies the next pulse to the next wire and corresponding resistance when the preceding pulse magnitudes are equivalent. An interrupting stops the test sequence when the compared pulses are unequal in magnitude, and an indicator then identifies the wire pair having conditions activating the sequence interrupter. While the Shuck et al tester is modern in construction and effective in its operation, a large number of electronic components are required to construct the tester thus limiting its compactness and portability, as well as its ease of manufacture. Further, as can be appreciated, the Shuck et al tester is quite expensive to construct due to the large number of electronic components contained therein and as such, there still exists an ongoing need for simpler and more economically constructed cable testers which are compact in size and which are highly reliable in their operation. In this regard, the present invention fulfills this need.

SUMMARY OF THE INVENTION

The general purpose of the present invention, which will be described subsequently in greater detail, is to provide a cable tester that has all the advantages of similarly employed prior art cable testers and none of the disadvantages. To attain this, the present invention comprises a cable tester constructed from only two mechanical parts and fourteen electrical components. Specifically, the present invention consists of a container having two cable receiving jacks mounted thereon along with red and green light emitting diodes. The respective jacks are operably connected to an electronic circuit which includes two integrated circuits having a plurality of NAND gates whereby various cable operating conditions can be sensed to effectively drive one or the other of the light emitting diodes. In this respect, the red light emitting diode is turned on in the event that a cable is improperly functioning, such as having a short circuit, open circuit, etc., while the green light emitting diode is turned on in the event that the cable is properly functioning. Additionally, an astable multivibrator circuit is included so as to cause the respective light emitting diodes to blink when they are driven by one or the other of the integrated circuits, thereby to save battery power supplied by a 9 volt transistor radio battery.

It is therefore an object of the present invention to provide a cable tester which has all of the advantages of similarly employed prior art cable testers and none of the disadvantages.

It is another object of the present invention to provide a cable checker which is compact and portable in construction.

It is a further object of the present invention to provide a cable checker which may be easily and economically manufactured.

Still another object of the present invention is to provide a cable checker which may be simply and easily operated by a user.

Yet another object of the present invention is to provide a cable checker which employs a minimum of electronic and mechanical parts in its construction.

Even another object of the present invention is to provide a cable checker which utilizes logic circuitry to perform a cable checking function.

A still further object of the present invention is to provide a cable checker which utilizes a portable power supply.

Still even another object of the present invention is to provide a cable checker which employs an astable multivibrator circuit to drive light emitting diodes associated therewith thereby to save battery power.

An even further object of the present invention is to provide a cable checker which has its power supply turned on in response to a cable being inserted into a jack associated therewith.

These together with other objects and advantages which will become subsequently apparent reside in the details of construction and operation as more fully hereinafter described and claimed, reference being had to the accompanying drawings forming a part hereof, wherein like numerals refer to like parts throughout.

BRIEF DESCRIPTION OF THE DRAWINGS

FIG. 1 is a perspective view of the cable checker forming the present invention and in which the electronic circuit of FIG. 1 is housed.

FIG. 2 is a circuit diagram of the electronic circuit associated with the cable checker forming the present invention.

DESCRIPTION OF THE PREFERRED EMBODIMENT

Figure 3:
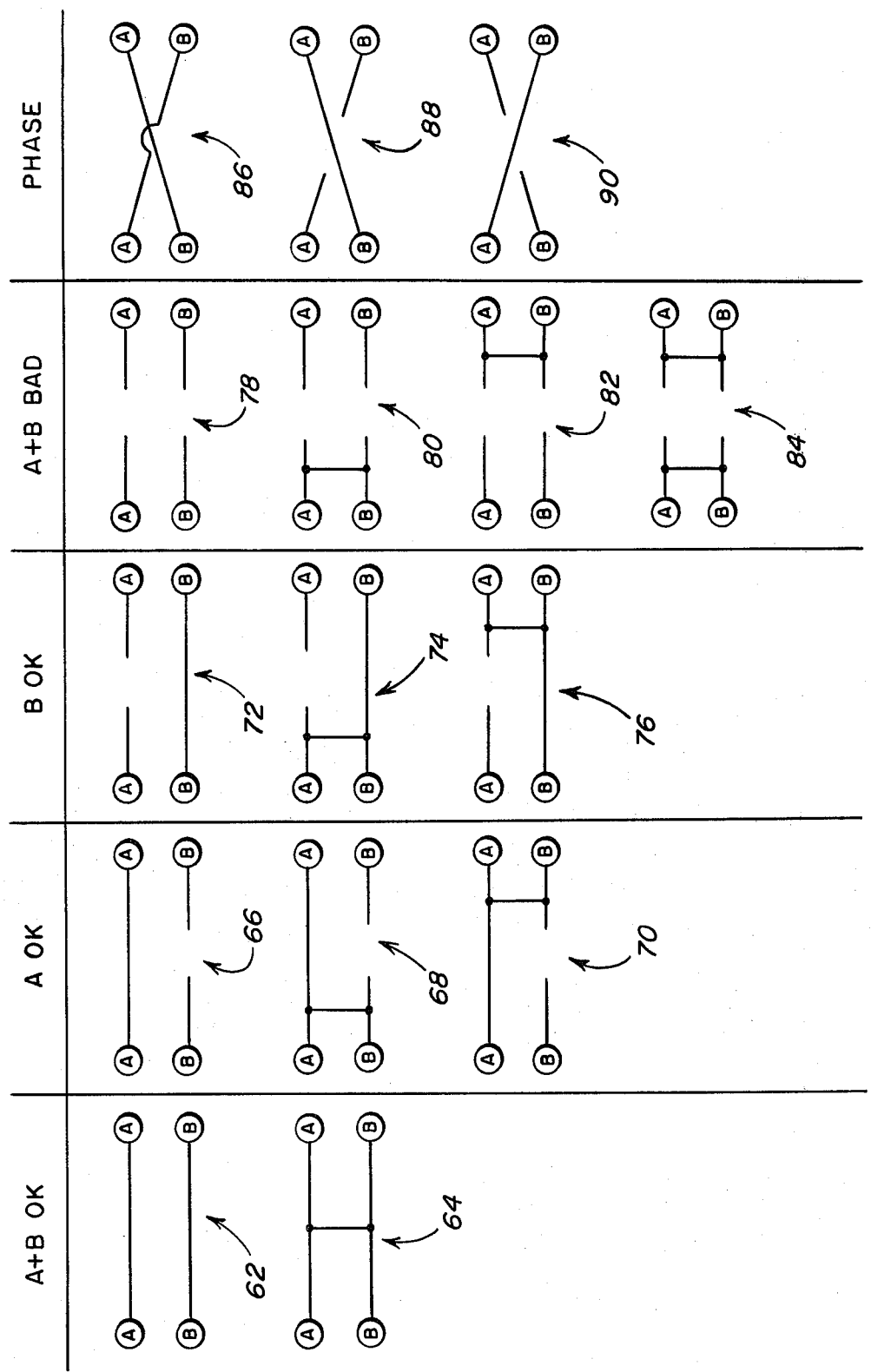
FIG. 3 is an instructional chart illustrating the various possible configurations of a two-wire cable whereby one or both of the wires within the cable might be functioning either properly or improperly.

With reference now to the drawings and in particular to FIG. 1, an automatic cable checker constructed in accordance with the present invention and generally designated by the reference numeral 10 is illustrated. In this respect, the cable checker 10 includes a housing 12 having a pair of light emitting diodes 14, 16 fixedly secured thereto, as well as a pair of cable receiving jacks 18, 20 operably positioned on an end thereof. As can be appreciated, the illustrated construction of the automatic cable checker permits a checking of a two-wire cable (not shown) by simply plugging the respective ends thereof into the two cable receiving jacks 18, 20. To facilitate the determining as to whether a cable is properly or improperly functioning, the light emitting diode 14 is of a red color, while the light emitting diode 16 is of a green color. The electronic circuitry of the present invention, which will be subsequently described, is so constructed as to drive the red light emitting diode 14 in the event that a cable is improperly functioning and to drive the green light emitting diode 16 in the event that a cable is properly functioning. As is apparent by reference to the cable checker 10 as shown in FIG. 1, the checker is constructed in a compact and portable manner and is easy to use since no switches or other mechanical components need to be actuated to facilitate an operation of the same.

Referring now to FIG. 2 of the drawings, the electronic circuit of the present invention is operably illustrated. In this connection, it can be appreciated that a cable tested in compliance with the operation of the present invention will include two wires therein, one such wire being indicated by the reference letter A and the second wire being electrically insulated from the first wire and being indicated by the reference B. As such, it can be seen that each jack 18, 20 will respectively be illustrated in the schematic of FIG. 2 as having an electrical relationship with both of the unshown cable wires A, B. Accordingly, when a cable is plugged into the jack 18, wire A establishes an electrical communication with the circuit 22 at point 24 while the wire B establishes an electrical communication with the circuit at point 26. Similarly, when the other end of the cable is plugged into jack 20, wire A establishes an electrical connection with the circuit 22 at point 28 and wire B establishes an electrical connection with the circuit at point 30. Of course, if the cable is functioning properly, a closed circuit will be established between points 24 and 28 by the wire A, while a closed circuit will be established between the points 26 and 30 by the wire B. In this respect, reference is next made to the inset 32 wherein it is illustrated the fact that the insertion of a cable into the jack 18 closes a switch 34 which effectively connects a 9-volt transistor radio battery 36 to the electronic circuit 22 so as to effectively drive the same. This construction eliminates the necessity of having a manually operated switch located externally of the circuit 22, such as mounting the same on the housing 12, and further serves to save electrical power which is supplied by the battery 36 by making sure that the battery powers the circuit only when a cable is inserted into the jack 18. By the same token, inset 38 illustrates the fact that the jack 20 must also have one end of the cable inserted therein so as to close the circuit whereby the battery 36 will supply power thereto.

The circuit 22 further includes a pair of digital logic integrated circuits 40, 42, each of which is a complementary metal-oxide-semiconductor part No. CMOS 4011, for both the confirmation and clocking circuitry. In this respect, the integrated circuits 40, 42 each comprise a plurality of NAND gates 44, 46, 48, 50 and 52, 54, 56, 58, respectively. As shown then, the jack 18 has the wire or conductor A connected at point 24 held high due to the positioning of the battery 36. Similarly, the conductor B attached at point 26 on jack 18 is at ground level. By the same token, jack 20 is just the opposite, with conductor A held at ground level at its connection point 28 while conductor B at connection point 30 is held high.

As such, if a properly working cable is plugged into the respective jacks 18, 20, pins 13 and 1 (NAND gates 44 and 48 respectively) of integrated circuit 40 will be high. Similarly, conductor B as seen from pins 8 and 9 of the NAND gate 46 contained in the integrated circuit 40 will be at a ground or low level. This low level applied to pins 8 and 9 of integrated circuit 40 will appear as a high level at the output on pin 10 of the integrated circuit. Accordingly, this high level on pin 10 is applied to pin 12 of NAND gate 44, thus resulting in pin 11 of NAND gate 44 going to a low level. This low level from pin 11 is then fed to pins 5 and 6 of NAND gate 50, which is also contained in the integrated circuit 40, and the resulting output on pin 4 of NAND gate 50 is at a high level. This circuitry will produce a high level output only when both conductor A and conductor B are in fact conducting. A high output will be produced even if conductor A and conductor B are shorted to one another, thus additional circuitry is required to check for a short between conductor A and conductor B.

Continuing then, it can be seen that the high output on pin 4 of NAND gate 50 is transmitted to pin 12 of NAND gate 52 contained in integrated circuit 42. By the same token, the high input on pin 1 of NAND gate 48, which is a part of the integrated circuit 40, is matched by a low input on pin 2 so that a high output is realized on pin 3 of the gate. As such, a high output is delivered to pin 13 of NAND gate 52, so that a low output is delivered to pin 11 of the integrated circuit 42. This low output, of course, will not drive the red light emitting diode 14 which would indicate a fault in the cable, while at the same time the low output realized at pin 11 of NAND gate 52 is delivered to pins 8 and 9 of NAND gate 54 whereby a high output is provided at pin 10 of NAND gate 54 so as to drive the green light emitting diode 16, thus indicating the proper functioning of the cable.

The circuit to check for a shorted condition between conductor A and conductor B also comes off of the inputs to the jacks 18, 20. In this respect, the A conductor is fed into pin 1 of NAND gate 48 and the B conductor is applied to pin 2 of NAND gate 48. As can be appreciated, when a short circuit exists between the conductors A and B, a low input is delivered to pin 13 of NAND gate 44 while a high input is delivered to pin 12 thereby resulting in a high output at pin 11. This high output at pin 11 is delivered to pins 5 and 6 of NAND gate 50 thus resulting in a low output on pin 4 which is delivered as an input to pin 12 of NAND gate 52 (integrated circuit 42). By the same token, the short circuit between conductors A and B results in a low input being delivered to pin 1 of NAND gate 48 and this in combination with the low input to pin 2 results in a high output on pin 3 of NAND gate 48. This high output on pin 3 is then delivered to pin 13 of NAND gate 52 so as to result in a high output at pin 11 of NAND gate 52 thereby driving the red light emitting diode 14 to thus indicate the fact that the cable is improperly functioning. Similarly, the high output at pin 11 is delivered to pins 8 and 9 of NAND gate 54 so that a low output on pin 10 of NAND gate 54 is realized at the green light emitting diode 16 thereby not permitting a lighting of the same.

As is apparent, the inversion of one driver to one light emitting diode 14 or 16 insures that only one of these light emitting diodes can be on at any given time. The remaining two NAND gates 56, 58 of integrated circuit 42 are used as an astable multivibrator circuit with an approximate frequency of 3 herz. The output of this astable multivibrator is connected to the cathodes of light emitting diodes 14 and 16, thus causing the light emitting diodes to blink on and off. This astable multivibrator circuit, which is generally designated by the reference numeral 60, is of a conventional well known construction, such circuits typically having two momentarily stable states between which they continuously alternate, remaining in each for a period controlled by the circuit parameters and switching rapidly from one to the other. Further, it should be noted that pins 7 of integrated circuits 40 and 42 are held at ground, as is well understood by one of ordinary skill in the art, while pins 14 of both of these integrated circuits will be connected to point 36 in FIG. 2, such being the normal operative mode of the respective chips.

Referring now to FIG. 3 of the drawings, there is illustrated therein 15 different possible configurations which represent either properly or improperly working cables. In this regard, configuration 62 is the only one where the green light emitting diode 16 will function to indicate a properly working cable. This configuration 62, of course, represents the above-mentioned operation of the circuit 22 with respect to a properly functioning cable. By the same token, configuration 64 represents a shorted circuit between the conductors A and B within a cable, and a functional descriptive operation of the circuit in response to this condition has also been above described.

FIG. 3 then further illustrates the 12 remaining possible faults which might exist in a 2-wire cable having conductors A and B. For example, it is possible that the conductor A might be properly functioning while a fault exists only in conductor B. In this connection, configurations 66, 68 and 70 illustrate such a state. As such, in each of these cases, the red light emitting diode 14 will be driven by the circuit 22 so as to indicate a cable fault. Similarly, it is possible that conductor B might be properly functioning, while a fault exists only in conductor A. Configurations 72, 74, 76 illustrate the possible situations where this might exist. Additionally, both conductors A and B might be improperly functioning, and configurations 78, 80, 82 and 84 illustrate these situations. Lastly, it is possible that the conductors A and B might be out of phase either due to one or the other of them being broken or simply being due to their reversal within the cable. Configurations 86, 88 and 90 illustrate these possible situations.

While a preferred embodiment of the present invention has been above described, it is to be understood that the optimum dimensional relationships for the parts of the invention are deemed readily apparent and obvious to one skilled in the art, and all equivalent relationships to those illustrated in the drawings and described in the specification are intended to be encompassed by the invention, subject only to limitations specifically appearing in the claims.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

What is claimed as new is as follows:

1. For use with an electric cable having opposite end connectors and a pair of conductors therein adapted to be coupled by said connectors to circuits, an apparatus for testing said cable, comprising a source of voltage, circuit coupling means engageable with said connectors for establishing separate conducting paths through the pair of conductors respectively to the source and to ground, logic circuit means connected to the circuit coupling means for continuously monitoring the current conducted through said pair of conductors in response to engagement of the connectors with the circuit coupling means, said logic circuit means including means for detecting abnormal current conducting patterns representing a plurality of defects in the cable, and indicator means connected to the logic circuit means for registering detection of any of the cable defects by the detecting means on a real time basis.

2. The apparatus as defined in claim 1 wherein said indicator means comprises a pair of visually distinguishable lamps respectively signifying the existence of at least one of the cable defects and the absence of any defects.

3. The apparatus as defined in claim 2 wherein the circuit coupling means comprises a pair of jack devices respectively connected to the source and to ground.

4. The apparatus as defined in claim 3 wherein the detecting means includes a gate section monitoring conductivity of said pair of conductors and shorting between said conductors, and a display control section connected to the gate section for alternately driving said pair of indicator lamps.

5. The apparatus as defined in claim 4 wherein said plurality of defects monitored number fourteen.

6. The apparatus as defined in claim 2 wherein the detecting means includes a gate section monitoring conductivity of said pair of conductors and shorting between said conductors, and a display control section connected to the gate section for alternately driving said pair of indicator lamps.

7. The apparatus as defined in claim 1 wherein the circuit coupling means comprises a pair of jack devices respectively connected to the source and to ground.

8. The apparatus as defined in claim 1 wherein said plurality of defects monitoring number fourteen.

9. The apparatus as defined in claim 1 wherein said detecting means includes a short detecting gate having a pair of inputs, a conductivity detecting gate having a pair of inputs, means for conducting current in one of the conductors in parallel to one of the inputs of both of the gates and conducting current in the other of the conductors only to the other of the inputs of the short detecting gate, and display controlling means connected to said gates for comparing the outputs thereof.

* * * * *